United States Patent
Kim et al.

(10) Patent No.: US 8,526,266 B2
(45) Date of Patent: Sep. 3, 2013

(54) ROW-DECODER CIRCUIT AND METHOD WITH DUAL POWER SYSTEMS

(75) Inventors: Jung Pill Kim, San Diego, CA (US);
Tae Hyun Kim, San Diego, CA (US);
Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 177 days.

(21) Appl. No.: 13/032,979

(22) Filed: Feb. 23, 2011

(65) Prior Publication Data
US 2012/0188816 A1 Jul. 26, 2012

Related U.S. Application Data

(60) Provisional application No. 61/435,004, filed on Jan. 21, 2011.

(51) Int. Cl.
*G11C 8/00* (2006.01)

(52) U.S. Cl.
USPC ...... 365/230.06; 365/148; 365/158; 365/163; 365/171

(58) Field of Classification Search
USPC ........... 365/149, 171, 230.06, 233.5, 185.17, 365/189.05, 189.16, 230.08, 190, 191, 194, 365/196, 148, 158, 163; 257/2–5, 9, 296, 257/310, E21.35, E31.047, E27.006; 438/29, 438/95, 96, 166, 135, 240, 259, 365, 482, 438/486, 597, 785
See application file for complete search history.

(56) References Cited

U.S. PATENT DOCUMENTS

| | | | | |
|---|---|---|---|---|
| 4,943,952 A | * | 7/1990 | Terayama | 365/207 |
| 4,959,816 A | * | 9/1990 | Iwahashi et al. | 365/233.5 |
| 5,056,064 A | * | 10/1991 | Iwahashi et al. | 365/233.5 |
| 5,099,143 A | | 3/1992 | Arakawa | |
| 5,287,325 A | * | 2/1994 | Morita | 365/230.06 |
| 5,412,331 A | * | 5/1995 | Jun et al. | 326/105 |
| 5,412,601 A | | 5/1995 | Sawada et al. | |
| 5,825,691 A | * | 10/1998 | McClure | 365/189.16 |
| 5,978,262 A | | 11/1999 | Marquot et al. | |
| 6,292,400 B1 | | 9/2001 | Dozza et al. | |
| 6,664,118 B2 | * | 12/2003 | Nishihara et al. | 438/3 |
| 7,139,205 B1 | | 11/2006 | Goldman et al. | |
| 7,593,259 B2 | | 9/2009 | Kim | |

(Continued)

FOREIGN PATENT DOCUMENTS
WO WO2008109768 9/2008

OTHER PUBLICATIONS

Byung-Do Yang et al: "A low-power charge-recycling ROM architecture", IEEE Transactions on Very Large Scale Integration (VLSI) Systems, IEEE Service Center, Piscataway, NJ, USA, vol. 11, No. 4, Aug. 1, 2003, pp. 590-600, XP011100556, ISSN: 1063-8210, DOI: 10.1109/TVLSI.2003.816138.

(Continued)

*Primary Examiner* — Harry W Byrne
(74) *Attorney, Agent, or Firm* — Sam Talpalatsky; Nicholas J. Pauley; Joseph Agusta

(57) ABSTRACT

A Spin-Transfer-Torque Magnetic Random Access Memory includes a dual-voltage row decoder with charge sharing for read operations. The dual-voltage row decoder with charge sharing for read operations reduces read-disturbance failure rates and provides a robust macro design with improved yields. Voltage from one of the power supplies can be applied during a write operation.

6 Claims, 11 Drawing Sheets

(56) References Cited

U.S. PATENT DOCUMENTS

| | | |
|---|---|---|
| 7,660,157 B2 | 2/2010 | Maejima et al. |
| 7,675,768 B1 * | 3/2010 | Kim .............................. 365/149 |
| 2004/0264281 A1 | 12/2004 | Vangal et al. |
| 2009/0103352 A1 * | 4/2009 | Kim .............................. 365/149 |

OTHER PUBLICATIONS

International Search Report and Written Opinion—PCT/US2012/022242—ISA/EPO—May 21, 2012.

* cited by examiner

ROW-DECODER CIRCUIT AND METHOD WITH DUAL POWER SYSTEMS

CROSS-REFERENCE TO RELATED APPLICATION

This application claims the benefit of U.S. Provisional Patent Application No. 61/435,004, entitled Row-Decoder Circuit And Method With Dual Power Systems filed on Jan. 21, 2011, the disclosure of which is expressly incorporated herein by reference in its entirety.

TECHNICAL FIELD

The present disclosure generally relates to magnetic random access memory (MRAM). More specifically, the present disclosure relates to spin transfer torque (STT) MRAM circuitry.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two layers has at least one pinned magnetic polarization (or fixed layer) set to a particular polarity. The magnetic polarity of the other magnetic layer (or free layer) is altered to represent either a "1" (e.g., anti-parallel to the fixed layer) or "0" (e.g., parallel to the fixed layer). One such device having a fixed layer, a tunneling layer, and a free layer is a magnetic tunnel junction (MTJ). The electrical resistance of an MTJ is dependent on the magnetic polarity of the free layer compared to the magnetic polarity of the fixed layer. A memory device such as MRAM is built from an array of individually addressable MTJs.

FIG. 1 is a circuit schematic illustrating a portion of a conventional magnetic random access memory (MRAM). An MRAM 100 is divided into a data circuit 160, and reference circuits 140, 110, each circuit 110, 140, 160 including multiple bit cells 112, 126 (only a single bit cell is illustrated to facilitate understanding). During read out of the bitcell of the data circuit 160, the resistance of the magnetic tunnel junction is compared to the effective resistance of the reference parallel MTJ of the reference circuit 110 connected in parallel with the reference anti-parallel bitcell of the reference circuit 140. Resistance of the bitcells are measured by applying a source voltage and determining an amount of current flowing through the bitcells. For example, in the bitcell of the parallel reference circuit 110, a current source 120 is applied to a magnetic tunnel junction (MTJ) 112 by read select transistors 122, 124, and a word line select transistor 126. The MTJ 112 includes a fixed layer 114, tunneling layer 116, and a free layer 118. When the free layer 118 and the fixed layer 114 have magnetizations aligned substantially parallel, the resistance of the MTJ 112, and thus the bitcell 110, is low. When the free layer 118 and the fixed layer 114 have magnetizations aligned substantially anti-parallel, the resistance of the MTJ 112, and thus the bitcell 110, is high.

Bitcells of a magnetic random access memory may be arranged in one or more arrays including a pattern of memory elements (e.g. MTJ in case of MRAM). STT-MRAM (Spin-Transfer-Torque Magnetic Random Access Memory) is an emerging nonvolatile memory and its advantages of non-volatility, comparable speed to eDRAM (Embedded Dynamic Random Access Memory), smaller chip size compared to eSRAM (Embedded Static Random Access Memory), unlimited read/write endurance, and low array leakage current have opened a great opportunity to STT-MRAM (Spin-Transfer-Torque Magnetic Random Access Memory) as a universal working memory in SoC (System on Chip) design. Key design challenges of STT-MRAM in SoCs are to ensure reliable operations with very low read-disturbance failure rate and high macro yield from robust design.

A disturbance-free read scheme with short WL (Word Line) pulse and lower WL voltage during read operation has been proposed as one method of reducing read disturbance failures and increasing macro yield. However, implementation of such a dual-voltage WL driver increases chip size and delays read speed due to the lower WL voltage during read operations. Moreover, reference cells using the reference WL scheme are more frequently accessed than normal cells and are more susceptible to read-disturbance issues.

BRIEF SUMMARY

Aspects of the present disclosure include a method include sharing charge, during a first memory operation, between a word line and a common node of a memory to obtain a first voltage level at the word line. The method includes performing the first memory operation using the first voltage level, and performing a second memory operation with a second voltage level.

In another aspect, a dual voltage driver memory includes a first voltage driver coupled to a common node and configured for supplying a word line voltage to a word line of the memory. The memory also includes at least one second voltage driver coupled to the common node and configured to supply a core voltage to the word line of the memory. The memory further includes control circuitry configured to control the first voltage driver and the second voltage driver and to provide a delay period between turning off the first voltage driver and turning on the second voltage driver with respect to memory access operations.

In yet another aspect, a voltage driver of a memory includes a voltage driver coupled to a common node and configured for supplying a word line voltage to a word line of the memory. The memory also includes a first capacitive coupling coupled to the common node. The memory further includes a second capacitive coupling coupled to the word line. The memory further includes a word line driver transistor coupled between the first capacitive coupling and the second capacitive coupling. The memory also includes control circuitry configured to control the voltage driver to float the common node to obtain a first voltage from a charge shared between the first capacitive coupling and the second capacitive coupling, the first voltage being applied during a first type of memory access operation.

In a still further aspect, a method includes the step of sharing charge, during a first memory operation, between a word line and a common node of a magnetic random access memory (MRAM) to obtain a first voltage at the word line. The method also includes the steps of performing the first memory operation using the first voltage, and performing a second memory operation with a second voltage.

In another aspect, a memory includes a first voltage driving means, coupled to a common node, for supplying a word line voltage to a word line of the memory. The memory also includes a second voltage driver means, coupled to the common node, for supplying a core voltage to the word line of the memory. The memory further includes control means for controlling the first voltage driving means and the second voltage driving means for providing a delay period between turning off the first voltage driving means and turning on the second voltage driving means with respect to memory access operations.

In a still further aspect, a memory includes a voltage driving means, coupled to a common node, for supplying a word line voltage to a word line of the memory. The memory also includes a first capacitive means, coupled to the common node, and a second capacitive means, coupled to the word line. The memory further includes a word line driving means, coupled between the first capacitive coupling and the second capacitive coupling, and control means. The control means is for controlling the voltage driving means to float the common node to obtain a first voltage from a charge shared between the first capacitive means and the second capacitive means, the first voltage being applied during a first type of memory access operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Aspects of the present disclosure include a dual voltage row decoder scheme with charge sharing for read operations, thus reducing read disturbance failure rates and providing a robust macro design with improved yields. Although the following aspects and embodiments are described with respect to STT-MRAM, the concepts described apply to other types of resistive memory, as well.

Figure 1:
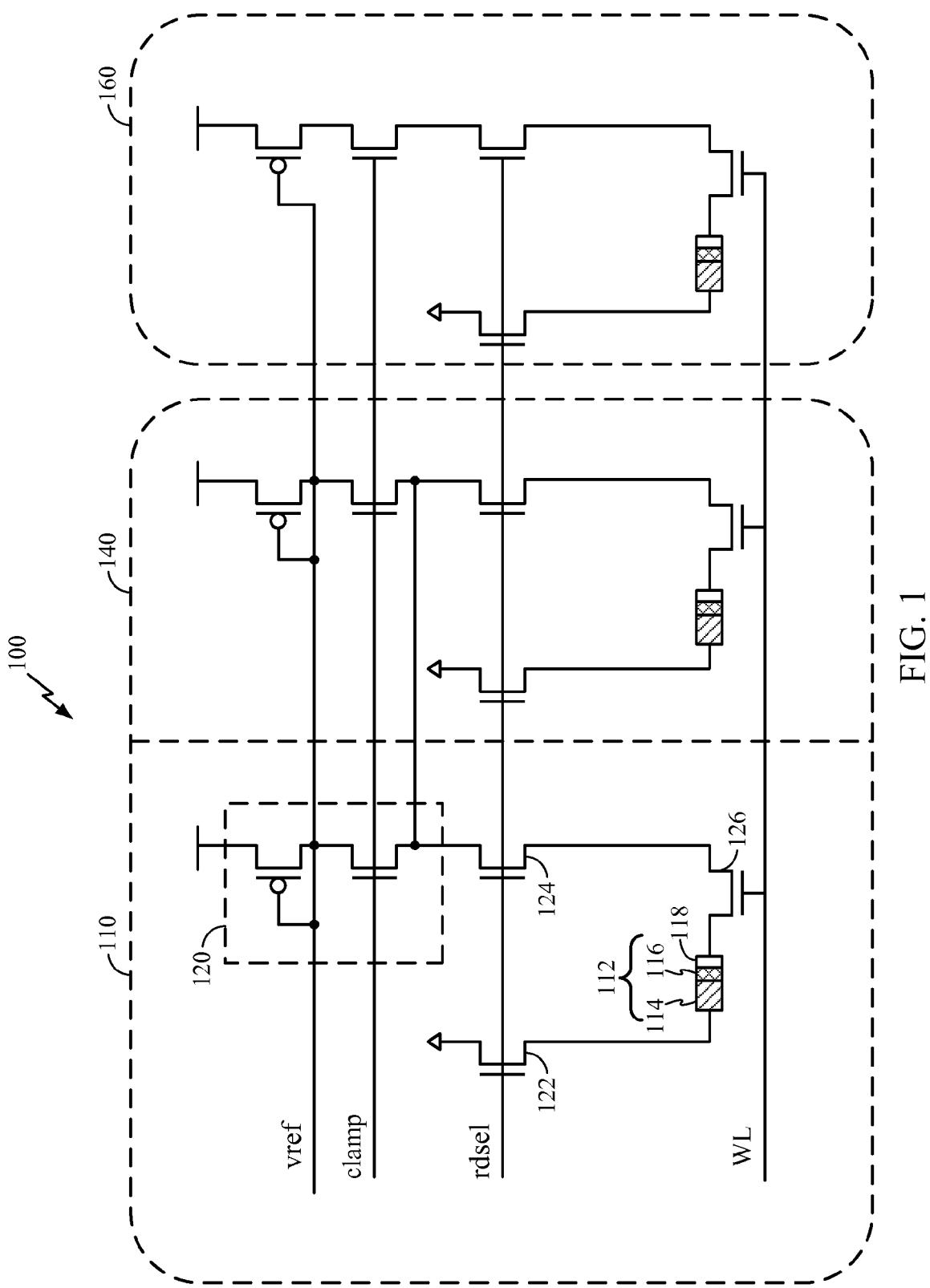
FIG. 1 is a circuit schematic illustrating a portion of a conventional magnetic random access memory (MRAM).
Figure 2:
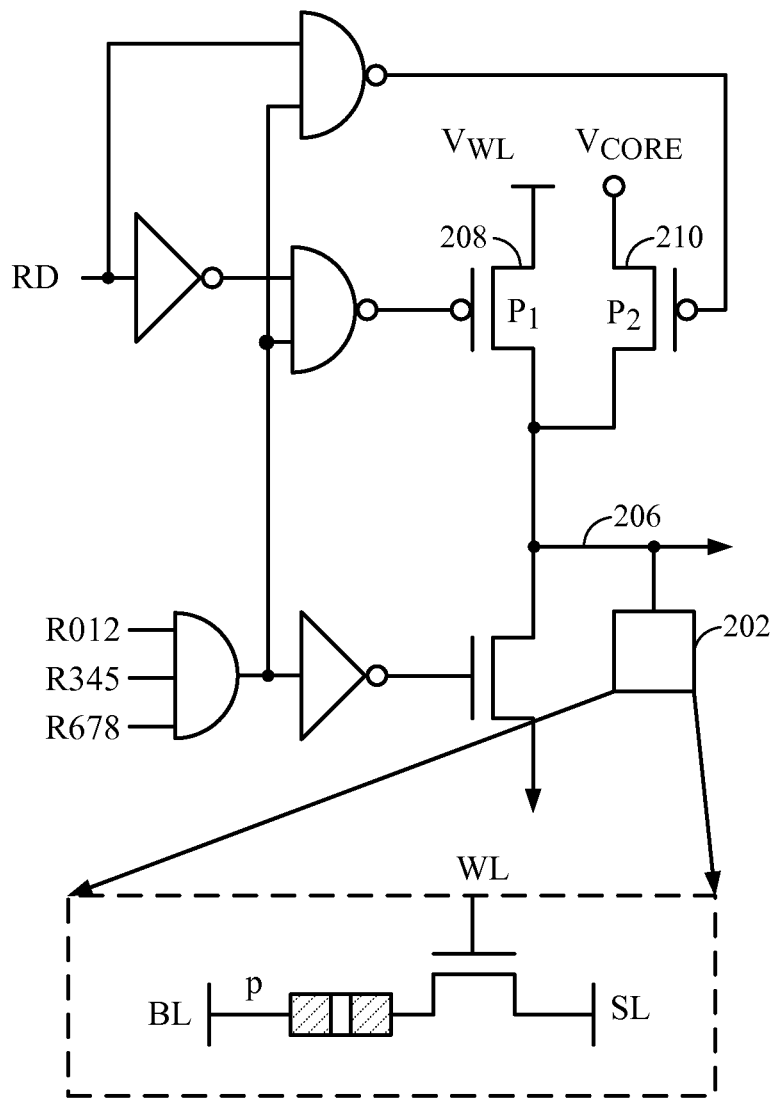
FIG. 2 is a circuit schematic illustrating dual voltage driver circuitry for MRAM according to the PRIOR ART.

According to one aspect of the disclosure, an STT-MRAM has two power supplies, 1.8V input/output supply $V_{IO}$ and 1.1V core supply ($V_{CORE}$). A 1.5V word line (WL) voltage, $V_{WL}$ may be generated by an internal regulator circuit using $V_{IO}$. FIG. 2 shows a dual voltage row decoder for a bit cell of an STT-MRAM. The bit cell 202 has an MTJ (Magnetic Tunnel Junction) element p coupled to a bit line BL and a source line SL. The word line (WL) 206 is driven to $V_{WL}$ for write operations and driven to near 1.1V for read operations. Lower read voltage helps to ensure disturbance-free read operation and reliability through product lifetime.

A prior art dual voltage row decoder shown in FIG. 2 includes $V_{WL}$ drivers 208 and $V_{CORE}$ drivers 210 for each unit row decoder. Each of the unit row decoders is coupled to the bit cell 202. Compared with a single voltage row decoder having only a single word line voltage, such as a 1.5V word line voltage, the dual-voltage arrangement shown in FIG. 2 adds an additional $V_{CORE}$ driver 210 and logic gates to the unit row decoder. However, the dual voltage row decoder scheme shown in FIG. 2 may increase a chip size by approximately 6% and slow read speed due to the lower voltage $V_{CORE}$ drivers used during read operations.

Figure 3A:
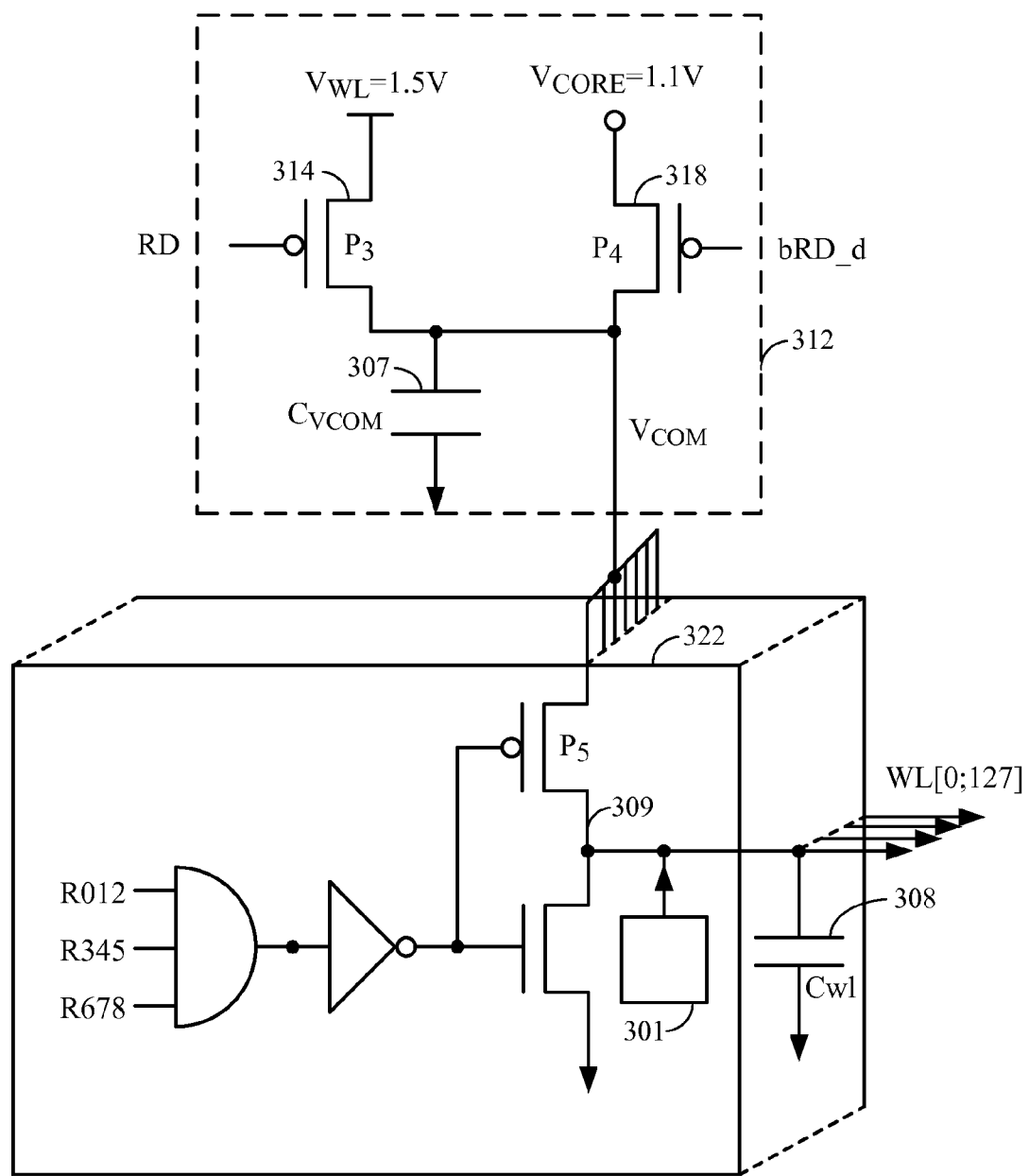
FIGS. 3A and 3B are circuit schematics illustrating voltage driver circuitry for MRAM according to one aspect of the present disclosure.

Aspects of the present disclosure overcome disadvantages of the dual voltage row decoder shown in FIG. 2. Referring to FIG. 3A, aspects of the present disclosure include a common dual voltage driver 312 for multiple row decoders 322 (e.g., 128 row decoders for a 1 Mb memory as seen in FIG. 3A). The schematic diagram for each of the unit row decoders 322 may be similar to or the same as a single voltage row decoder or the prior art dual voltage row decoder shown in FIG. 2, except that the source node of the PMOS transistor $P_5$ is coupled to an output node $V_{COM}$ of the common dual voltage driver 312.

In the embodiment shown in FIG. 3A, the common dual voltage driver 312 is connected to each of a number of unit row decoders 322 which each are coupled to a bit cell 301. The common dual voltage driver 312 includes a $V_{WL}$ driver 314 and a $V_{CORE}$ driver 318. The source node of the PMOS transistor $P_5$ in each of the unit row decoders 322 is coupled to an output node $V_{COM}$ of the common dual voltage driver 312. By sharing a common dual voltage driver 312 with a number of unit row decoders according to this embodiment, chip size increase of the dual voltage implementation is reduced or minimized. Input row addresses (e.g., R012, R345, and R678) select the transistor $P_5$.

Figure 4:
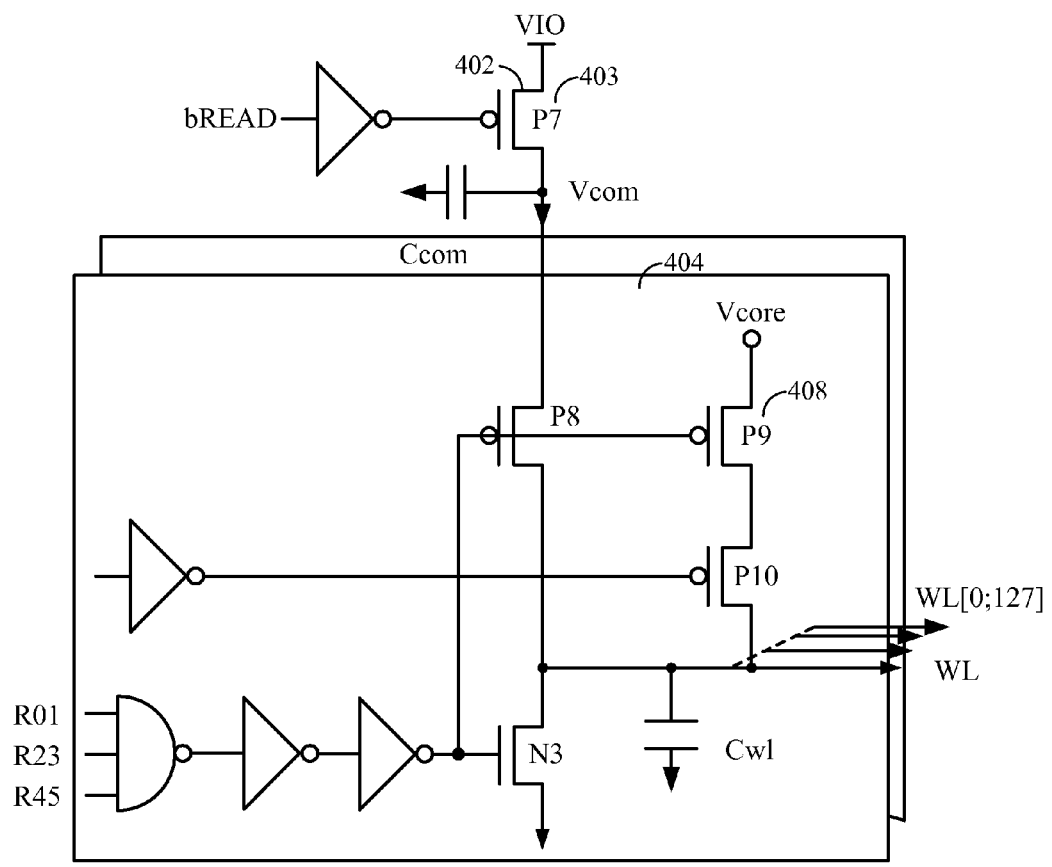
FIG. 4 is a circuit schematic illustrating dual voltage driver circuitry for MRAM according to one aspect of the present disclosure

In an alternative embodiment of the present disclosure shown in FIG. 4 a common voltage driver 403 is connected to each of a number of unit row decoders 404 which are each coupled to a bit cell (not shown). A source node of the PMOS transistor $P_8$ in each of the unit row decoders 404 is coupled to an output node $V_{COM}$ of the common voltage driver 403. Input row addresses (e.g., R01, R23, and R45) select the transistor $P_8$. In this embodiment, the common voltage driver 403 includes a $V_{WL}$ driver 402. Unlike the embodiment shown in FIG. 3A, the common voltage driver in the embodiment shown in FIG. 4 does not include a $V_{CORE}$ driver. Instead, this embodiment includes a $V_{CORE}$ driver 408 in each of the unit row decoders 404.

The embodiments of the present disclosure shown in FIG. 3A and FIG. 4 provide charge sharing resulting from operation of the two different control signals, RD which controls the $V_{WL}$ driver and bRD_d which controls the $V_{CORE}$ driver. RD and bRD are both signals generated during a read operation with opposite and delayed phase. The RD signal goes high during a read operation whereas the bRD signal goes low during a read operation.

Referring to FIG. 3A, a first capacitive coupling 307 is provided between the output node $V_{COM}$ of the common dual voltage driver 312 and another node, such as a ground node for example. A second capacitive coupling 308 is provided between a WL node 309 in each of the unit row decoders 322 and the other node, such as a ground node for example.

It should be understood by persons skilled in the art, that either or both of the first capacitive coupling 307 and second capacitive coupling 308 can be provided by parasitic capacitance without necessarily adding discrete capacitive entities to the circuitry. According to this embodiment, the control signal RD turns off the $V_{WL}$ driver 314 for a period t, before the control signal bRD_d turns on the control $V_{CORE}$ driver 318. During the time period t, the first capacitive coupling 307 is floated, i.e., disconnected from either a $V_{WL}$ source or a $V_{CORE}$ source. A word line driver transistor P5 is coupled between the first capacitive coupling 307 and the second capacitive coupling 308 and allows charge to be shared between the first capacitive coupling 307 and the second capacitive coupling 308 during the time period t. This charge sharing allows the output node $V_{COM}$ of the common dual voltage driver 312 to pre-charge to a voltage approximating the voltage to be supplied by the $V_{CORE}$ driver 318 shortly before the $V_{CORE}$ driver 318 is turned on and results in a faster read operation despite the relatively low $V_{CORE}$ voltage level. Additional capacitance at the capacitive coupling 307 can be added to meet the target voltage at node $V_{COM}$ after charge sharing.

Figure 3B:
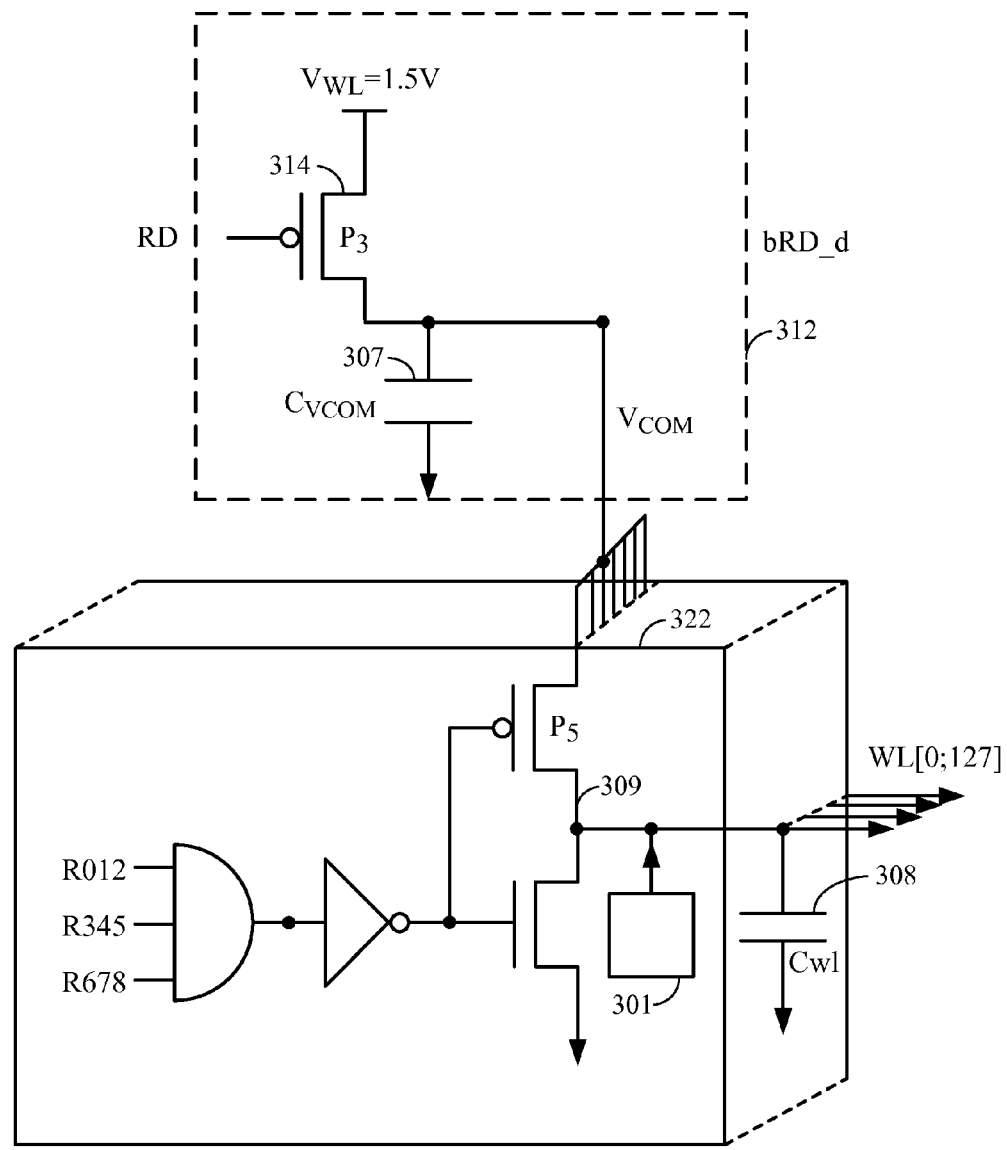

An alternate embodiment is shown in FIG. 3B. In this embodiment, only power from the $V_{WL}$ driver 314 is used for charge sharing to generate the desired voltage level.

Figure 5:
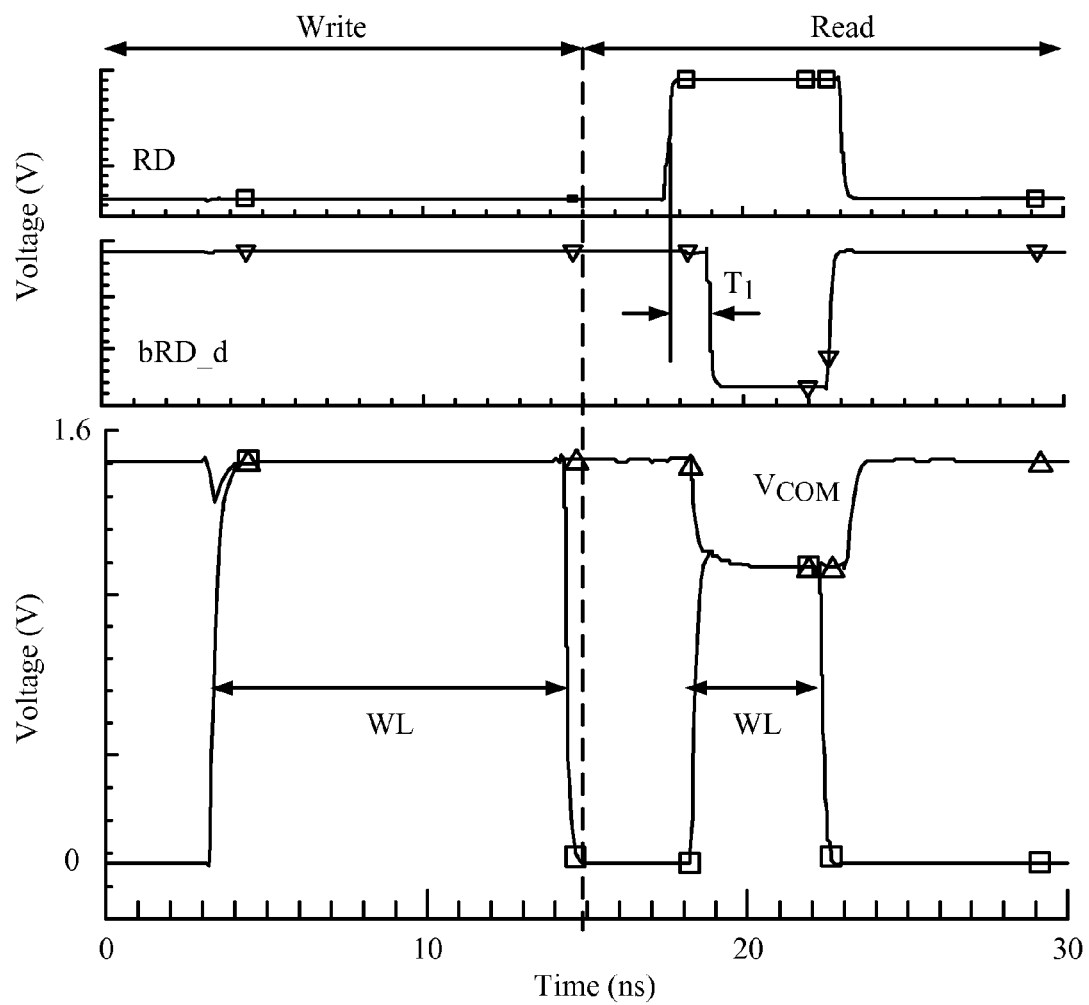
FIG. 5 is a simulation timing diagram illustrating control signal waveforms and resulting word line voltage timing according to aspects of the present disclosure.

FIG. 5 shows signal waveforms for better understanding the operation of the arrangement shown in FIG. 3A according to aspects of the present disclosure. Referring to both FIG. 5 and FIG. 3A, during a read operation and time interval $T_1$, the $V_{COM}$ node is pre-charged to $V_{WL}$ and is floated because the transistors $P_3$ and $P_4$ are turned off. Charge sharing occurs between parasitic capacitances $C_{VCOM}$ 307 of the $V_{COM}$ node and the parasitic capacitance $C_{wl}$ 308 of the word line WL when the transistor $P_5$ is selected by input row addresses. This operation quickly raises the word line voltage to near $V_{CORE}$ level by the higher gate to source voltage ($V_{GS}$) of the transistor $P_5$ compared to the gate to source voltage of the transistor $P_4$. That is, the high gate to source voltage ($V_{GS}$) of the transistor $P_5$ enables a faster charge sharing operation than possible with the circuit discussed with respect to FIG. 2.

Figure 6:
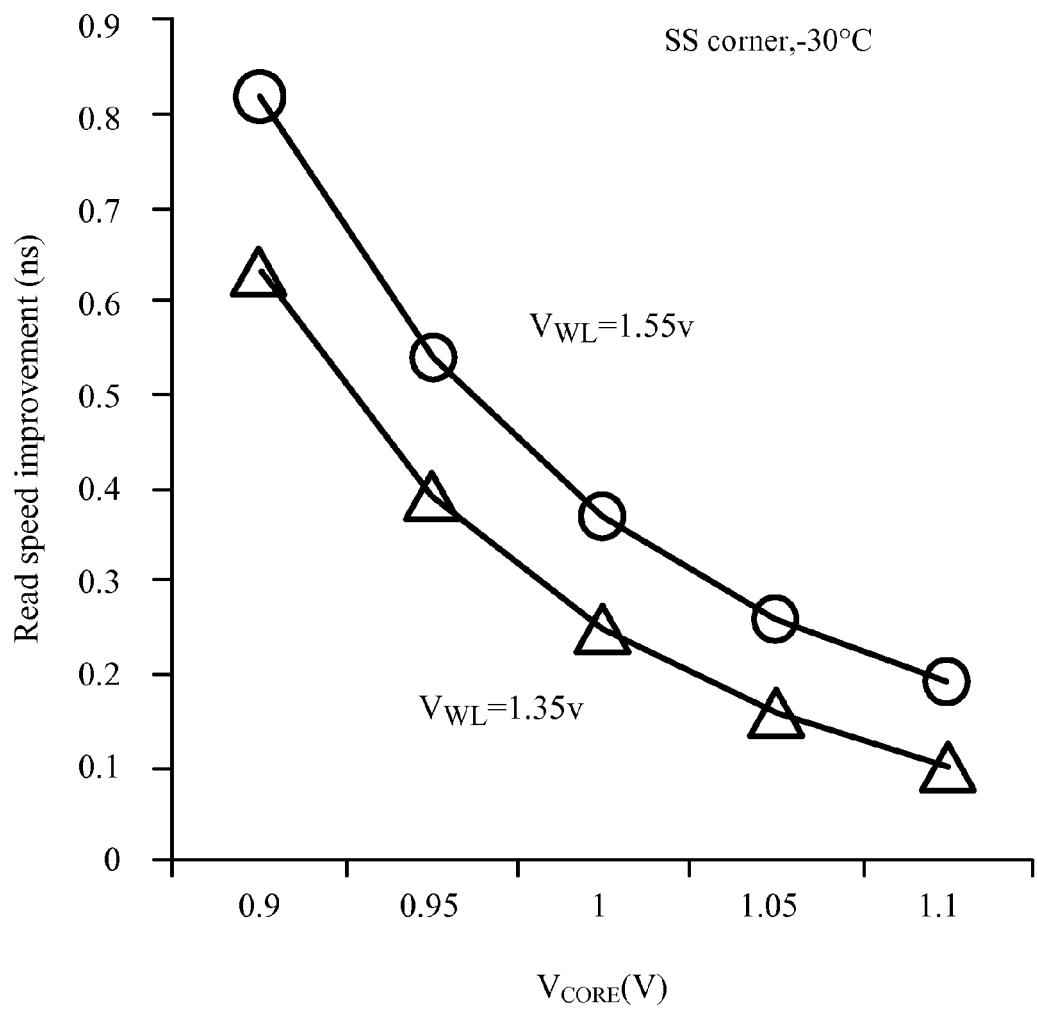
FIG. 6 is a graph illustrating improvements in read operation speed provided by aspects of the present disclosure as compared to the PRIOR ART.

When the bRD_d signal goes low after charge sharing, the $V_{COM}$ node settles to $V_{CORE}$ level through the transistor $P_4$. For write operations, the transistor $P_3$ supplies $V_{WL}$ to the WL as the transistor $P_4$ is turned off. FIG. 6 compares read speed between FIG. 2 and FIG. 3A at 45 nm technology. In this example, a read speed improvement of about 500 picoseconds occurs at 0.95V $V_{CORE}$, SS corner and −30° C.

Figure 7:
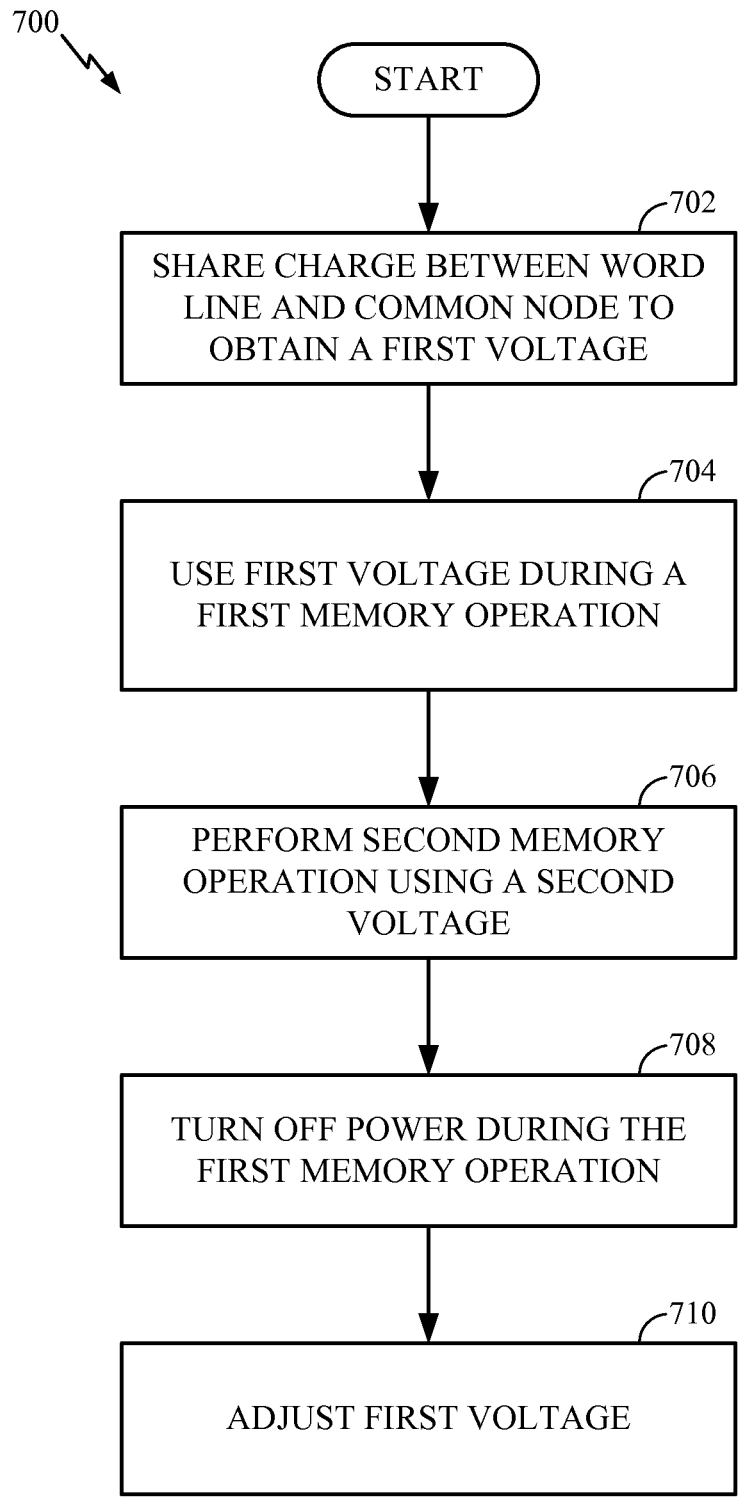
FIG. 7 is process flow diagram illustrating a method for providing dual power levels to a memory according to aspects of the present disclosure.

A method 700 for providing dual power levels to a memory according to an aspect of the present disclosure is described with reference to FIG. 7. At block 702, the method includes sharing charge, during a first memory operation, between a word line and a common node to obtain a first voltage at the word line. At block 704, the first memory operation includes using the first voltage of the dual voltage driver. At block 706, the method includes performing a second memory operation with a second voltage. In an illustrative embodiment, the first memory operation includes a read operation. A number of unit row decoders can be coupled to the common node to provide power for each of the decoders. At block 708, the power from both the word line voltage driver $V_{WL}$ and the core voltage driver $V_{CORE}$ is turned off during the first memory operation. At block 710, the first voltage may be adjusted, for example by turning on a core voltage driver, to achieve a pre-defined voltage during the first operation.

Figure 8:
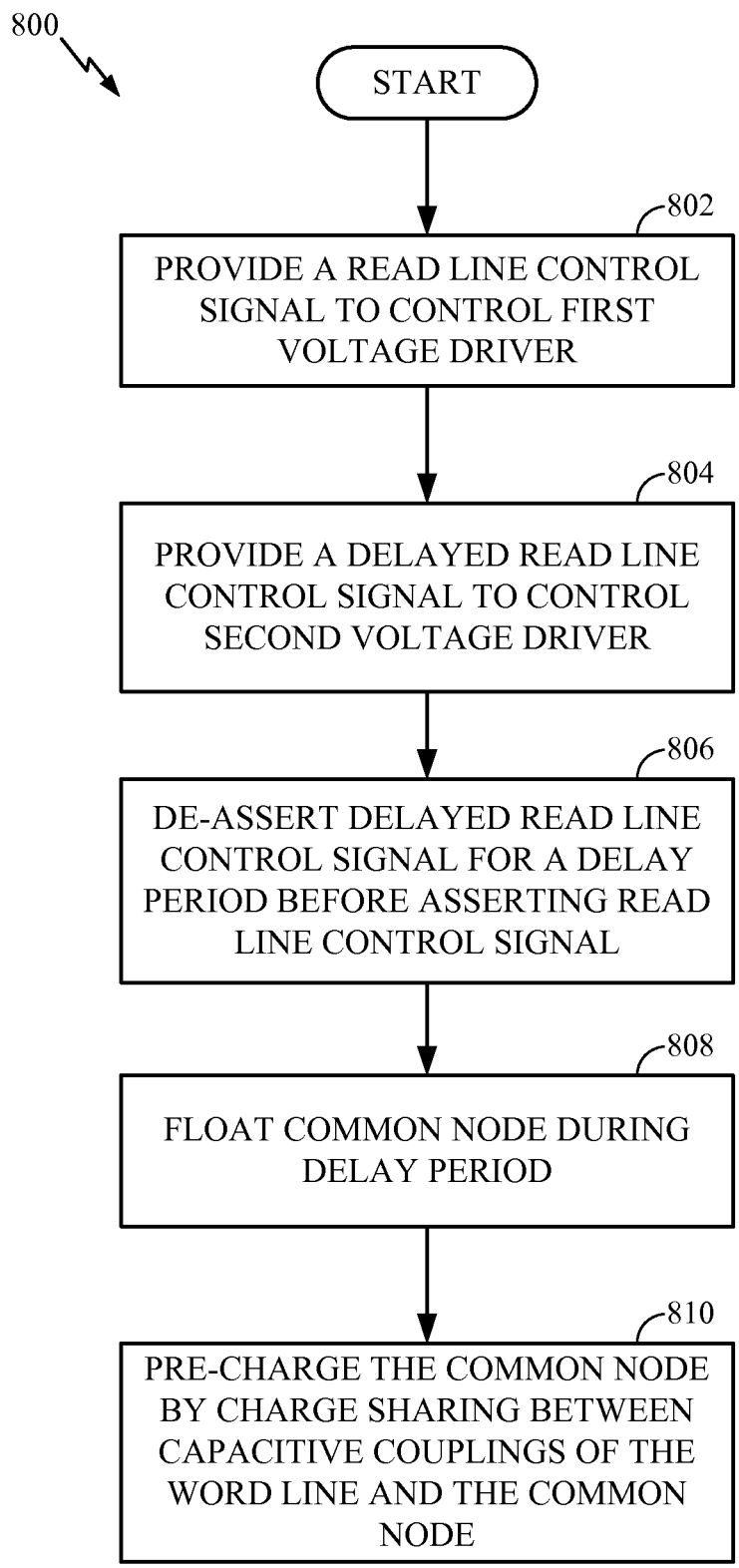
FIG. 8 is process flow diagram illustrating a method for providing dual power levels to a memory according to aspects of the present disclosure.

Referring to FIG. 8, a method for providing dual power levels to a memory according to an aspect of the present disclosure may include providing a read line control signal to control a first voltage driver of the memory, at block 802. A delayed read line control signal is provided at block 804 to control a second voltage driver of the memory. In this embodiment, the first voltage driver and the second voltage driver are coupled to a common node. In block 806, a first memory operation includes turning off the common power by de-asserting the delayed read line control signal for a delay period before asserting the read line control signal. In block 808, the common node is floated during the delay period. In block 810, and the common node voltage is determined by charge sharing between a capacitive coupling of the common node and a capacitive coupling of the word line.

Figure 9:
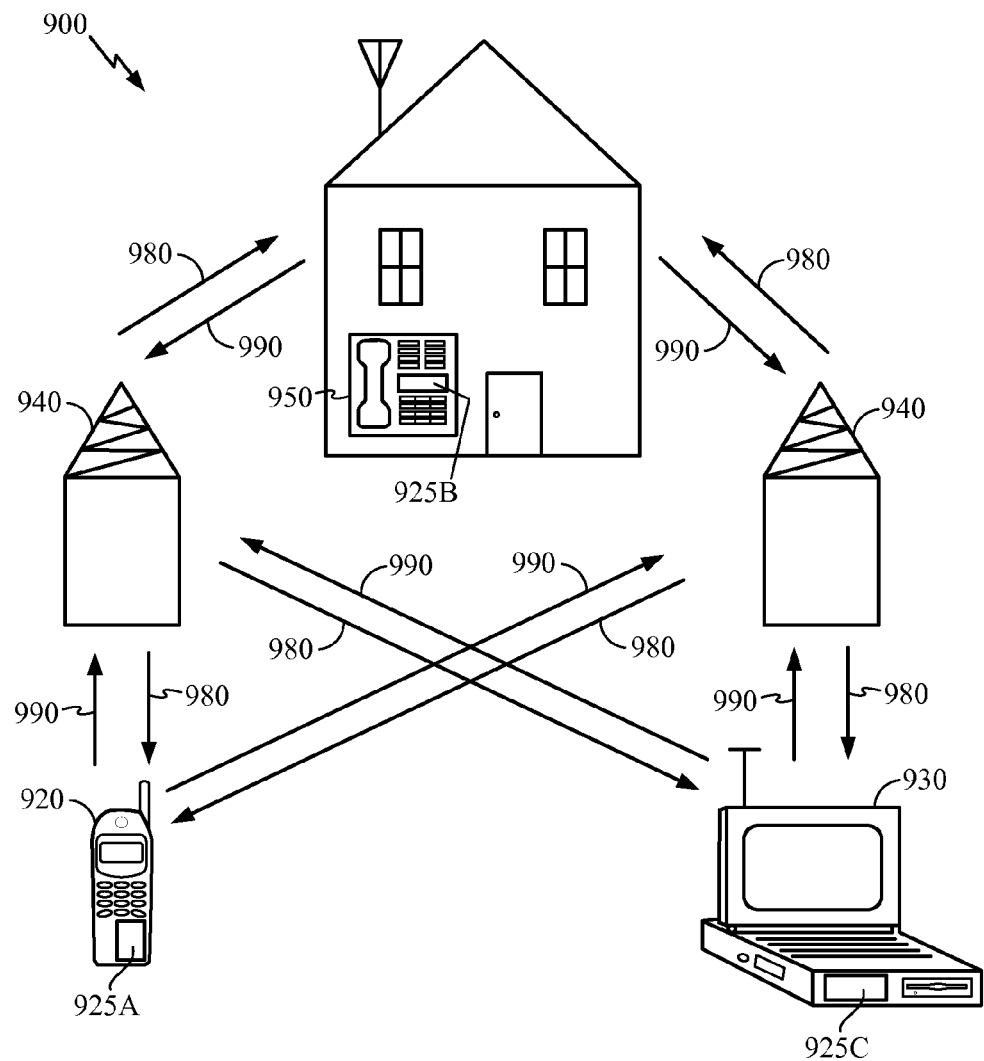
FIG. 9 is a block diagram showing an exemplary wireless communication system in which an embodiment of the disclosure may be advantageously employed.

FIG. 9 is a block diagram showing an exemplary wireless communication system 900 in which an embodiment of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B, that include the disclosed MRAM. It will be recognized that other devices may also include the disclosed MRAM, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 9 illustrates remote units according to the teachings of the disclosure, the disclosure is not limited to these exemplary illustrated units. Embodiments of the disclosure may be suitably employed in any device which includes MRAM.

Figure 10:
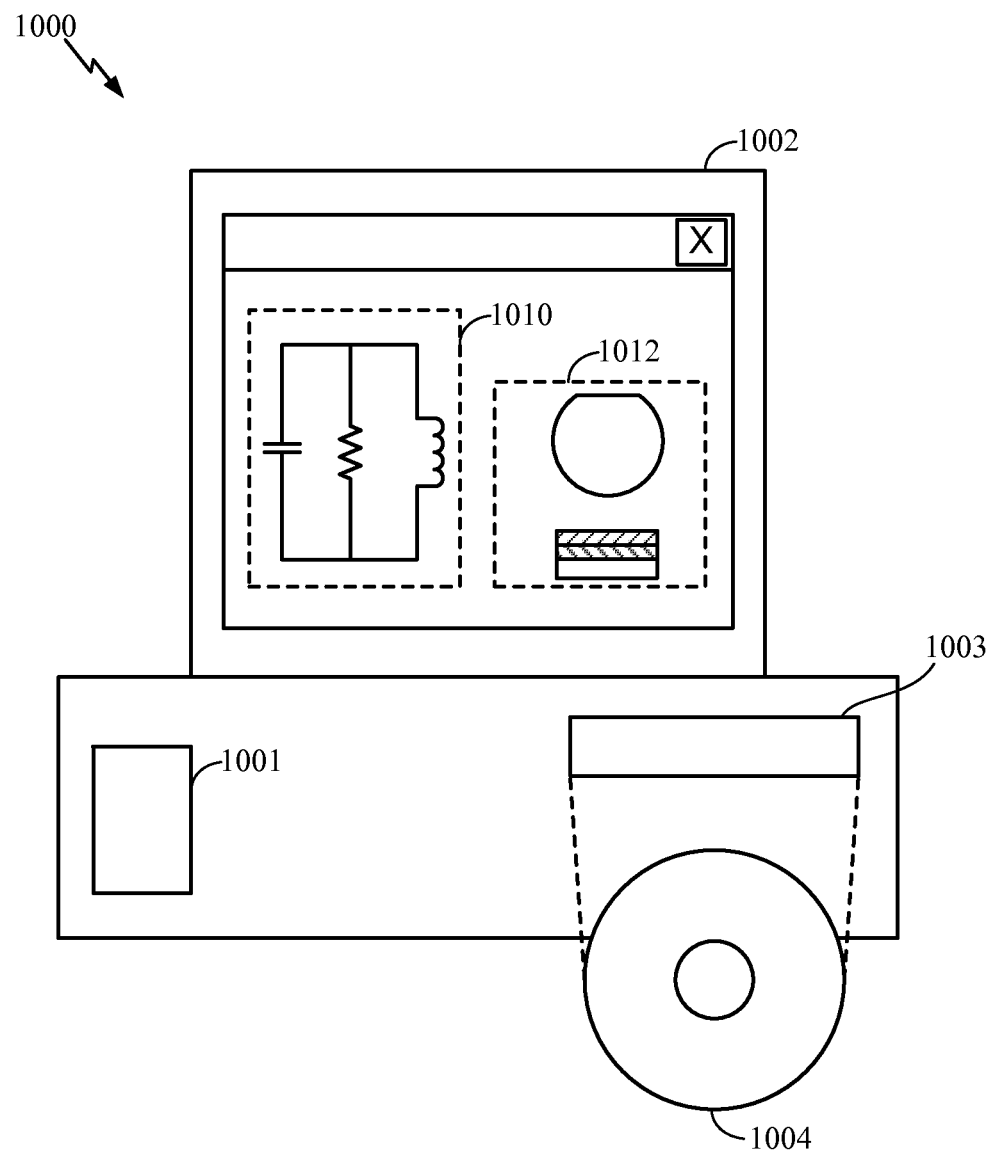
FIG. 10 is a block diagram illustrating a design workstation used for circuit, layout, and logic design of a semiconductor component according to one embodiment.

FIG. 10 is a block diagram illustrating a design workstation used for circuit, layout, and logic design of a semiconductor component, such as the MRAM as disclosed above. A design workstation 1000 includes a hard disk 1001 containing operating system software, support files, and design software such as Cadence or OrCAD. The design workstation 1000 also includes a display to facilitate design of a circuit 1010 or a semiconductor component 1012 such as a packaged integrated circuit having MRAM. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory, comprising:
   a first voltage driver coupled to a common node and configured for supplying a word line voltage to a word line of the memory;
   at least one second voltage driver coupled to the common node and configured to supply a core voltage to the word line of the memory;
   control circuitry configured to control the first voltage driver and the second voltage driver and to provide a delay period between turning off the first voltage driver and turning on the second voltage driver with respect to memory access operations;
   a first capacitive coupling coupled to the common node;
   a second capacitive coupling coupled to the word line; and
   a word line driver transistor coupled between the first capacitive coupling and the second capacitive coupling.

2. The memory of claim 1, in which the common node is configured to float during the delay period and to receive a shared charge from the first capacitive coupling and the second capacitive coupling during the delay period for establishing a predefined voltage at the common node for a first type of memory access operation.

3. The memory of claim 1, further comprising:
   a plurality of unit row decoders, each including a word line coupled to the common node.

4. The memory of claim 3, in which the at least one second voltage driver comprises a single voltage driver coupled to the common node.

5. The memory of claim 3 in which the at least one second voltage driver comprises a separate second voltage driver in each of the plurality of unit row decoders.

6. The memory of claim 1, integrated into at least one of a mobile phone, a set top box, a music player, a video player, an entertainment unit, a navigation device, a computer, a hand-held personal communication systems (PCS) unit, a portable data unit, and a fixed location data unit.

\* \* \* \* \*